(12) United States Patent
Yasugi et al.

(10) Patent No.: US 6,912,761 B2
(45) Date of Patent: Jul. 5, 2005

(54) METHOD OF PRODUCING MULTILAYER PIEZOELECTRIC RESONATOR

(75) Inventors: Toshiyuki Yasugi, Omihachiman (JP); Yuji Fujino, Shiga-ken (JP); Shoichi Kawabata, Otsu (JP); Mamoru Ogawa, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 336 days.

(21) Appl. No.: 10/269,367

(22) Filed: Oct. 12, 2002

(65) Prior Publication Data

US 2003/0070271 A1 Apr. 17, 2003

(30) Foreign Application Priority Data

Oct. 17, 2001 (JP) .......................................... 2001-319284

(51) Int. Cl.[7] .......................... H04R 17/00; H01L 41/04; H01L 41/08; H01L 41/18; H01L 2/00
(52) U.S. Cl. .......................... 29/25.35; 29/412; 29/417; 29/594; 29/830; 29/831; 29/846; 310/328
(58) Field of Search ............................. 29/25.35, 594, 29/846, 412, 417, 831; 310/366, 328, 359

(56) References Cited

U.S. PATENT DOCUMENTS

| | | | | |
|---|---|---|---|---|
| 4,564,782 A | * | 1/1986 | Ogawa | 310/359 |
| 4,633,366 A | * | 12/1986 | Maher | 361/321.5 |
| 5,118,982 A | * | 6/1992 | Inoue et al. | 310/366 |
| 5,900,790 A | * | 5/1999 | Unami et al. | 333/187 |
| 5,912,600 A | * | 6/1999 | Unami | 333/187 |

FOREIGN PATENT DOCUMENTS

| | | |
|---|---|---|
| JP | 10-004330 | 1/1998 |
| JP | 2000-174581 | 6/2000 |

* cited by examiner

*Primary Examiner*—Carl J. Arbes
*Assistant Examiner*—Tai Nguyen
(74) *Attorney, Agent, or Firm*—Keating & Bennett, LLP

(57) ABSTRACT

A method of producing a piezoelectric resonator includes the steps of forming first to third internal electrodes by printing an electrically conductive paste onto a green sheet, punching out portions of the green sheet having the first to third internal electrodes formed thereon, so that at least three types of green sheets are punched out with a location of the internal electrode serving as a reference location, in which the first sheet is punched out by shifting a punching location by a first shift amount in a first direction with respect to the reference location, the second sheet is punched out by shifting a punching location by the first shift amount in a direction opposite to the first direction, and the third sheet is punched out at the reference location, forming a layered body by stacking the punched out green sheets, and forming a unit by cutting the layered body.

12 Claims, 8 Drawing Sheets

METHOD OF PRODUCING MULTILAYER PIEZOELECTRIC RESONATOR

BACKGROUND OF THE INVENTION

1. Field of the Invention

The present invention relates to a method of producing a multilayer piezoelectric resonator for use in, for example, a filter for a cellular phone.

2. Description of the Related Art

A length mode piezoelectric resonator which has a high design freedom in terms of characteristics, which has little spurious, and which makes it possible to increase a difference Δf between a resonant frequency and an antiresonant frequency has been provided (for example, described in Japanese Unexamined Patent Application Publication No. 10-4330).

FIG. 10 shows an example of a length mode piezoelectric resonator 30. The piezoelectric resonator 30 includes a substrate 31 having a plurality of piezoelectric layers 32 and a plurality of internal electrodes 33 alternately stacked upon each other, with the piezoelectric layers 32 at both sides of the corresponding internal electrodes 33 being polarized in opposite directions as indicated by arrows P. Insulating films 34 and 35 which cover every other internal electrode 33 are provided at opposing surfaces of the substrate 31. External electrodes 36 and 37 are disposed on top of the insulating films 34 and 35, respectively. Accordingly, the external electrodes 36 and 37 are alternately connected to every other internal electrode 33.

This type of piezoelectric resonator has a problem in that metals, such as Ag-Pd, used in the internal electrodes 33 diffuse in ceramic material during baking. When the metals diffuse, the effective area of each of the internal electrodes 33 is reduced, so that Δf is reduced.

To overcome this problem, the applicant proposed a piezoelectric resonator including float electrodes provided in its ceramic layers between the internal electrodes or in its outermost ceramic layers. The float electrodes are not connected to the external electrodes and are provided separately from the internal electrodes (Japanese Unexamined Patent Application Publication No. 2000-174581). In that case, the float electrodes restrict the diffusion of the internal electrodes in the ceramic material during baking, so that it is possible to prevent a reduction in the effective areas of the internal electrodes.

In a method of producing the above-described piezoelectric resonator, steps such as those described below are carried out. After a green sheet has been provided by forming a ceramic slurry into the form of a sheet, portions of this green sheet are punched out to have rectangular shapes to provide rectangular green sheets. An internal electrode is printed onto one of the green sheets using a first pattern, and is, then, dried. A float electrode is printed onto another green sheet using a second pattern which is different from the first pattern, and is, then, dried. Thereafter, the green sheet having the first pattern, a green sheet having a pattern which is inverted 180 degrees from the first pattern, and the green sheet having the second pattern are placed upon each other in a predetermined order, are aligned with reference to their external shapes, and are press-bonded together, so that a layered body is formed. The layered body is cut to form a unit, which is baked and polarized. After polarization, the unit is cut to form a strip in order to form insulating layers, external electrodes, etc., on the strip, after which the strip with the insulating layers and external electrodes disposed thereon is cut to form individual devices.

However, in order to prevent such float electrodes described above from coming into electrical conduction with the external electrodes, it is necessary to make the float electrodes smaller than the internal electrodes. Therefore, when printing the electrodes onto the green sheets, it is necessary to print the float electrodes using patterns which are different from the patterns of the internal electrodes. In addition, at least two types of green sheets having different patterns printed thereon must be provided. Consequently, there are disadvantages in that the production process becomes complicated and that costs are increased.

Further, in the related method of producing the above-described piezoelectric resonator, electrodes are printed onto the green sheets which have been previously punched out with rectangular shapes, and the green sheets are, while being aligned with reference to their external shapes, placed upon each other and press-bonded together. Therefore, positional displacements thereof during the printing directly affect the precision with which the electrodes are positioned. Consequently, the precision with which the electrodes are positioned is low, so that a desired electrical characteristic sometimes cannot be obtained.

SUMMARY OF THE INVENTION

In order to overcome the problems described above, preferred embodiments of the present invention provide a method of producing a multilayer piezoelectric resonator which makes it possible to prevent a reduction in a difference Δf between a resonant frequency and an antiresonant frequency by preventing diffusion of an internal electrode during baking, to reduce production costs by using one type of print pattern, and to increase stacking precision.

According to a preferred embodiment of the present invention, a method of producing a multilayer piezoelectric resonator includes the steps of forming internal electrodes by printing an electrically conductive paste with a certain shape onto a surface of a green sheet formed of piezoelectric ceramic, punching out portions of the green sheet having the internal electrodes formed thereon with certain sizes, so that at least three types of green sheets including a first green sheet, a second green sheet, and a third green sheet, are punched out with a particular location of its corresponding internal electrode serving as a reference location, in which the first green sheet is punched out by shifting a punching location by a first shift amount in a first direction with respect to the reference location, the second green sheet is punched out by shifting a punching location by the first shift amount in a direction opposite to the first direction, and the green third sheet is punched out at the reference position, forming a layered body by placing the punched out green sheets upon each other in a predetermined order, forming a unit by cutting the layered body, with the cutting operation being performed so that the internal electrode formed on the first green sheet and the internal electrode formed on the second green sheet are exposed at opposing end surfaces of the unit, and so that the internal electrode formed on the third green sheet is not exposed at an end surface of the unit, and forming a ceramic sintered body by baking the unit formed by the cutting operation.

According to another preferred embodiment of the present invention, a method of producing a multilayer piezoelectric resonator includes the steps of forming internal electrodes by printing an electrically conductive paste with a certain shape onto a surface of a green sheet formed of piezoelectric ceramic, punching out portions of the green sheet having the internal electrodes formed thereon with certain sizes, so that at least three types of green sheets including a first green sheet, a second green sheet, and a third green sheet, are punched out with a particular location of its corresponding internal electrode serving as a reference location, in which the first sheet is punched out by shifting a punching location by a first shift amount in a first direction with respect to the reference location, the second sheet is punched out by shifting a punching location by a second shift amount in a direction substantially at right angles to the first direction, and the third sheet is punched out at the reference position, forming a layered body by placing the punched out green sheets upon each other in a predetermined order, forming a unit by cutting the layered body, with the cutting operation being performed so that the internal electrode formed on the first green sheet and the internal electrode formed on the second green sheet are exposed at adjacent end surfaces of the unit, and so that the internal electrode formed on the third green sheet is not exposed at an end surface of the unit, and forming a ceramic sintered body by baking the unit formed by the cutting operation.

In one of the preferred embodiments of the present invention, electrodes are not printed after punching out portions of a green sheet with certain shapes as they are in the related example. Instead, after printing electrically conductive pastes onto the green sheet with the same forms, and forming the internal electrodes on the green sheet, portions of this green sheet are punched out with certain sizes. Here, with a particular position of each of the internal electrodes serving as a reference position, at least three types of sheets including a first green sheet, a second green sheet, and a green third sheet, are punched out from the green sheet having the internal electrodes formed thereon. The first green sheet is punched out by shifting a punching location by a first shift amount in a first direction with respect to the reference position, the second green sheet is punched out by shifting a punching location by the first shift amount in an opposite direction to the first direction, and the third green sheet is punched out at the reference position. The first and second green sheets are punched out by shifting the punching locations by the first shift amount from the reference position so that the internal electrodes formed at their surfaces are exposed at opposing end surfaces of the unit when a unit has been formed by cutting the layered body. The internal electrode formed at the third green sheet is such as not to be exposed at an end surface of the unit when a unit has been formed by cutting the layered body. In other words, the third green sheet is punched out so that the internal electrode becomes a float electrode. Since the punching-out operations are carried out with the electrode patterns as references, the precision with which the internal electrode and the outer periphery of each of the punched out green sheets are positioned with respect to each other is kept high, so that, by only placing the green sheets upon each other in the vertical direction at the time of stacking, the electrodes are placed upon each other with high positional precision. After forming a unit by cutting the layered body formed by placing the green sheets upon each other in this way, the unit is baked. Here, since the float electrodes are provided between the internal electrodes and at the outer sides of the unit, diffusion of metals of the internal electrodes in the ceramic is reliably prevented during the baking, so that it is possible to prevent a reduction in Δf. In addition, since only one type of print pattern needs to be used, the production process is greatly simplified, and the process from printing to punching to stacking can be carried out in one production line, thereby allowing for greatly reduced production costs.

In another preferred embodiment of the present invention, the shift directions at the time when the first sheet and the second sheet are punched out are substantially at right angles instead of in opposite directions, and the first and second shift amounts may be different.

Here, when a unit has been formed by cutting the layered body, the internal electrode formed at the surface of the first green sheet and the internal electrode formed at the surface of the second green sheet are exposed at adjacent end surfaces of the unit. The internal electrode formed at the third green sheet is not exposed at an end surface, so that it becomes a float electrode. In this way, even if one type of print pattern is used, by changing the shift direction during the punching-out operation, an end surface where an internal electrode is exposed can be arbitrarily changed, thereby providing the advantage of increased design freedom of the multilayer piezoelectric resonator.

In another preferred embodiment of the present invention, the first shift amount and the second shift amount are preferably larger than the thicknesses of the corresponding green sheets between corresponding adjacent internal electrodes in a thickness direction.

The reason for this is as follows. When the shift amounts X and Y are smaller than the thicknesses of the corresponding green sheets, the outer peripheral edges of the corresponding opposing internal electrodes in the thickness direction are substantially aligned, so that delamination during baking and cracking during polarization tend to occur. Delamination and cracking affect post-processing operations after baking. Therefore, the shift amounts are set as specified above in order to prevent delamination and cracking.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
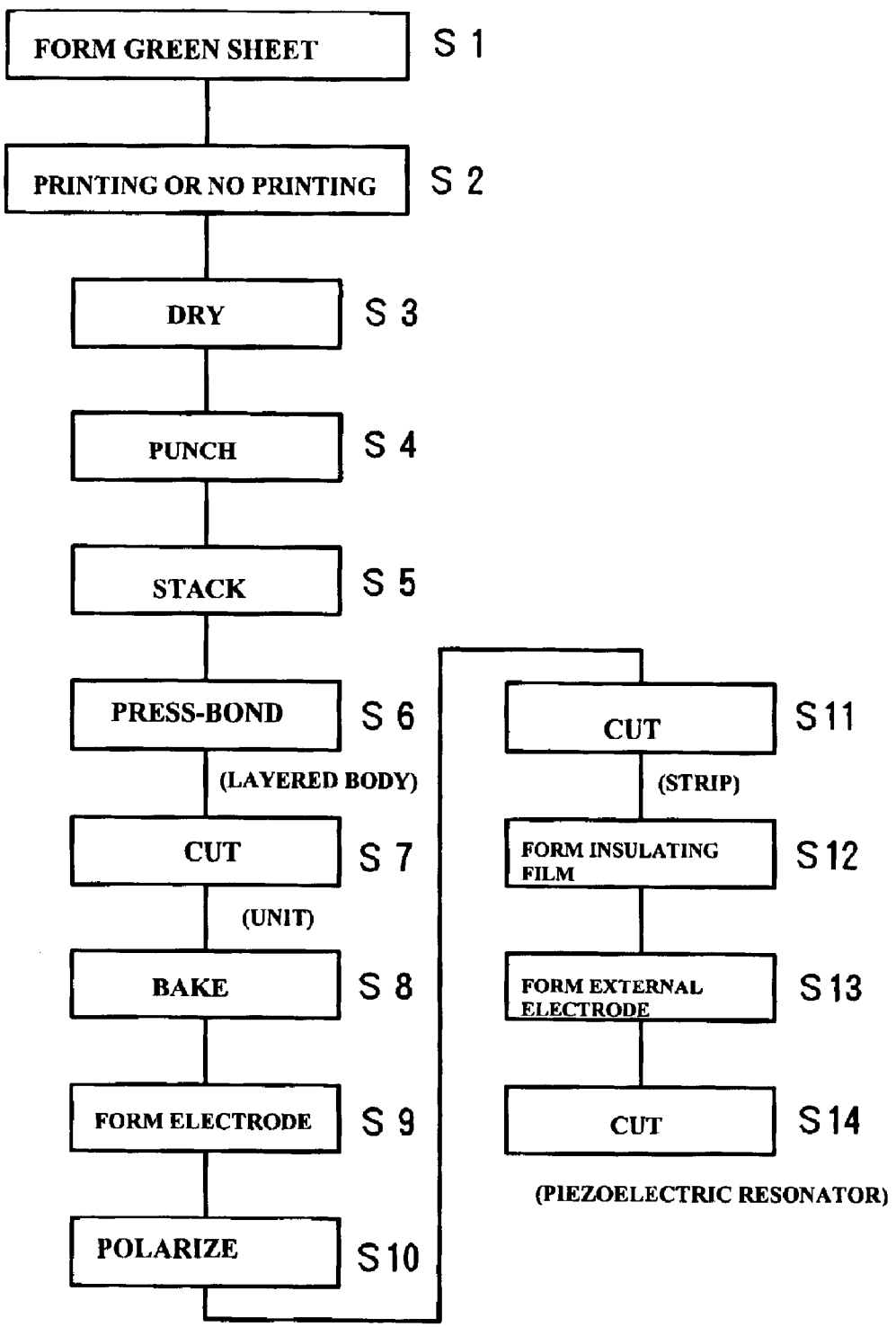
FIG. 1 illustrates the steps for producing a multilayer piezoelectric resonator of a preferred embodiment of the present invention.
Figure 2:
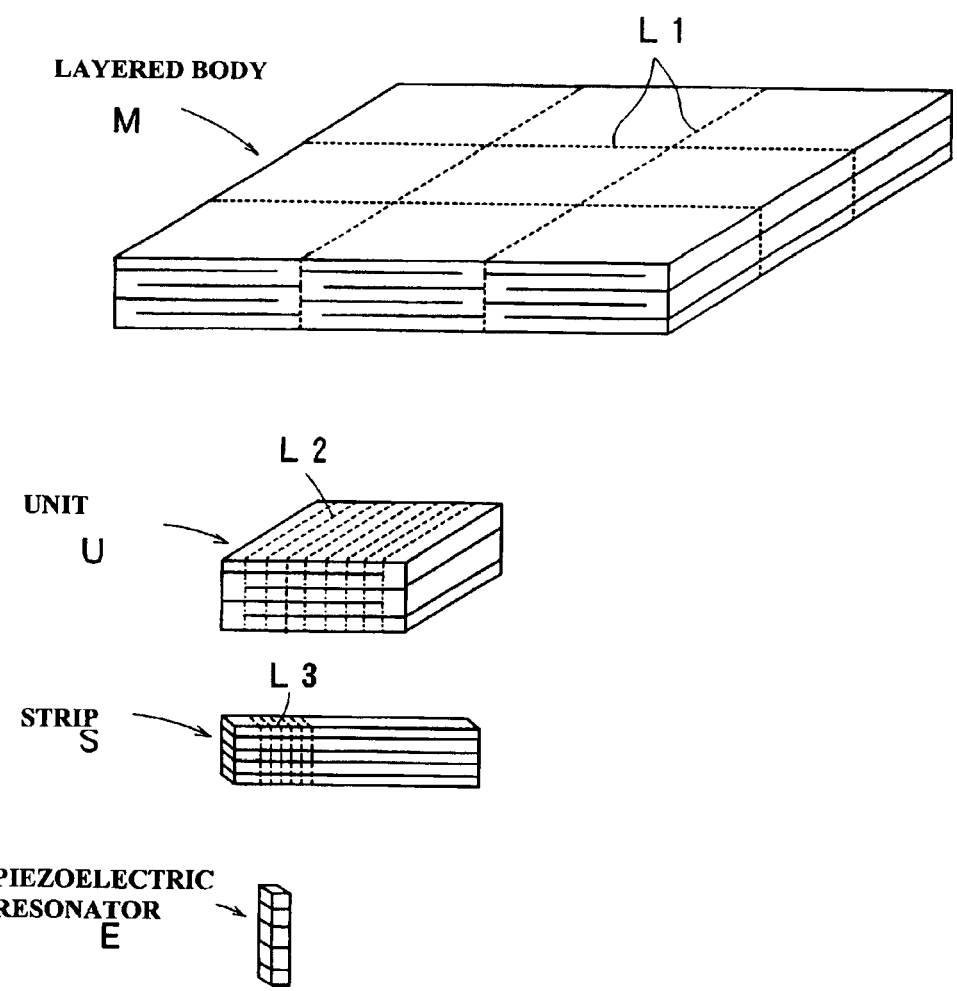
FIG. 2 is a perspective view of a layered body, a unit, a strip, and a device, in the process of producing the multilayer piezoelectric resonator.

FIG. 1 is an overall flowchart of a method of producing a length mode multilayer piezoelectric resonator according to a preferred embodiment of the present invention. FIG. 2 illustrates the forms of a layered body M, a unit U, a strip S, and a device E in the process of producing the multilayer piezoelectric resonator.

First, in Step S1, a continuous green sheet is produced by forming a ceramic slurry into the form of a sheet. In Step S2, internal electrodes are printed onto some portions of the continuous green sheet, but not on other portions of the continuous green sheet. In Step S3, the internal electrodes are dried. Thereafter, in Step S4, portions of the continuous green sheet are punched out with certain shapes in order to form a plurality of green sheets. In Step S5, the plurality of green sheets are placed upon each other in a predetermined order, and, in Step S6, the plurality of green sheets are press-bonded together to form a layered body M. In Step S7, the layered body M formed in this manner is cut form a unit U (shown in FIG. 2) along a line L1 shown in FIG. 2. Then, in Step S8, the unit U is baked. In Step S9, polarization electrodes are formed at side surfaces of the baked unit (ceramic sintered body) U at which the internal electrodes are exposed. In Step S10, polarization is carried out. After the polarization, in Step S11, the unit U is cut along a line L2 shown in FIG. 2 in order to form a strip S. In Step S12, insulating films 34 are formed on the strip S. Then, in Step S13, external electrodes 36 and 37 are formed on top of the insulating films 34. Thereafter, in Step S14, by cutting the strip S along a line L3 shown in FIG. 2, a piezoelectric resonator E is formed.

Figure 3:
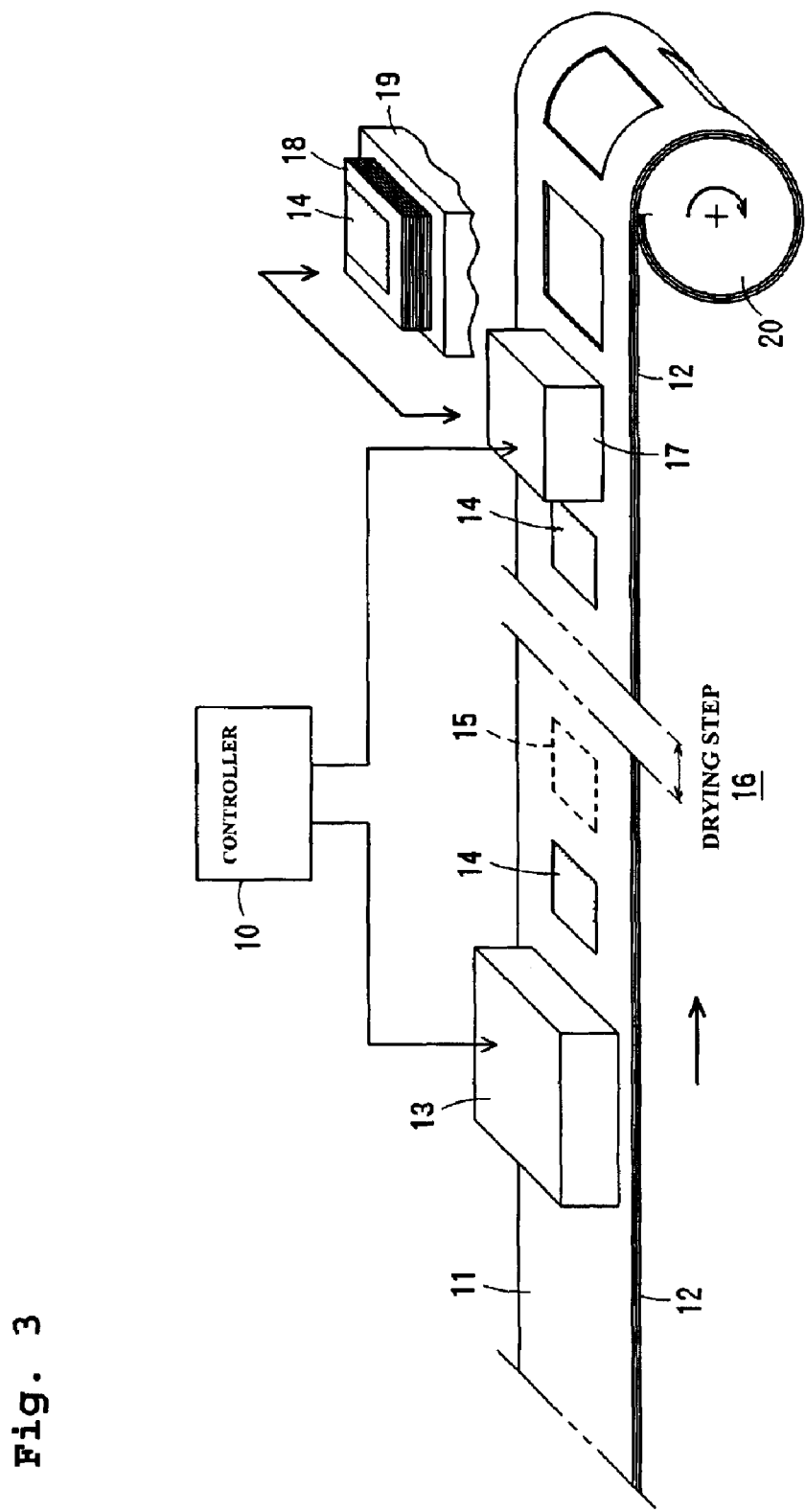
FIG. 3 illustrates a device for producing the layered body.

FIG. 3 shows an example of a device for producing the above-described layered body M.

The order in which sheets are placed upon each other and sheet information are input to a controller 10 for controlling a printing device 13 and a punching device 17. The order in which the sheets are placed upon each other are from top to bottom as follows with reference to the example shown in FIG. 6 described later:

D→D→C→B→C→A→C→B→C→A→ . . .

where A represents a sheet having an internal electrode 3, B represents a sheet having an internal electrode 4, C represents a sheet having a float electrode 5, and D represents a sheet having no electrode.

The sheet information refers to types A to D of the green sheet 11 to be placed upon each other, and shift amount X when portions of the green sheet 11 having electrodes formed thereon are punched out.

The green sheet 11 serving as a base for ceramic layers 2 is preferably formed by forming a ceramic slurry into the form of a sheet with a thickness of the order of about 20 $\mu$m to about 200 $\mu$m on a carrier film 12 by, for example, a doctor blade method and by drying the formed sheet. The green sheet 11 is transported in the direction of the arrow shown in FIG. 3 along with the carrier film 12.

When the carrier film 12 is transported to the location of the printing device 13, the screen printing device 13 screen-prints an electrode 14 of a certain shape onto the surface of the green sheet 11 using an electrically conductive paste such as Ag—Pd paste. Not only is an electrode 14 of a certain shape consistently formed, but also a blank portion 15 without an electrode is formed at a predetermined time based on a command from the controller 10. Although, in order to simplify the description, only a single electrode 14 is shown in FIG. 3, a plurality of electrodes 14 are actually formed with predetermined arrangement patterns. The portion of the green sheet 11 which has passed by the printing device 13 reaches a location for carrying out a drying step 16 where the electrode 14 is dried.

The portion of the green sheet 11 that has been subjected to the drying step 16 reaches a location below the punching device 17. The punching device 17 determines a punching location based on a command from the controller 10, and punches out three types A to C of green sheets 18 of a certain size (but larger than the electrode 14) from the green sheet 11. More specifically, with a characteristic point of the electrode 14 (such as a portion of the electrode 14 or a marker provided at a certain location separately from the electrode 14) serving as a reference position $(x, y)=(0, 0)$, the sheet A is formed by punching out a location at $(x, y)=(X, 0)$, the sheet B is formed by punching out a location at $(x, y)=(-X, 0)$, and the sheet C is formed by punching out the location at $(x, y)=(0, 0)$ or the reference location. In order to precisely know the characteristic point of the electrode 14, a related image recognition method or other suitable method may be used.

The three types A to C of the green sheets 18 formed in this way are successively placed upon each other on a stacking table 19 in the order in which they have been punched out. For the first few or last few (for example, two) green sheets 18 or for any of the intermediate sheets 18, a green sheet having a blank portion (not having an electrode 14) may be used. After the green sheets 18 have been punched out, the green sheet 11 and the carrier film 12 are taken up onto a take-up roll 20.

Portions of the green sheet 11 having the electrodes 14 previously formed as described above are punched out in a previously determined order with reference to the locations of the corresponding electrodes and with a previously determined shift amount X, so that the electrodes of the green sheets 18 that have been punched out are always precisely positioned. Accordingly, when the green sheets 18 are placed upon each other with the external forms of the green sheets 18 aligned, highly precise stacking can be carried out without the influence of shifted printing of an electrode 14.

The green sheets 18 that have been placed upon each other as described above are transported to a press-bonding section (not shown), and are press-bonded together at the press-bonding section, so that the layered body M is formed. The layered body M is severed to form a unit U by a cutter, and the severed unit U is baked at a baking furnace and becomes a ceramic sintered body.

Figure 4:
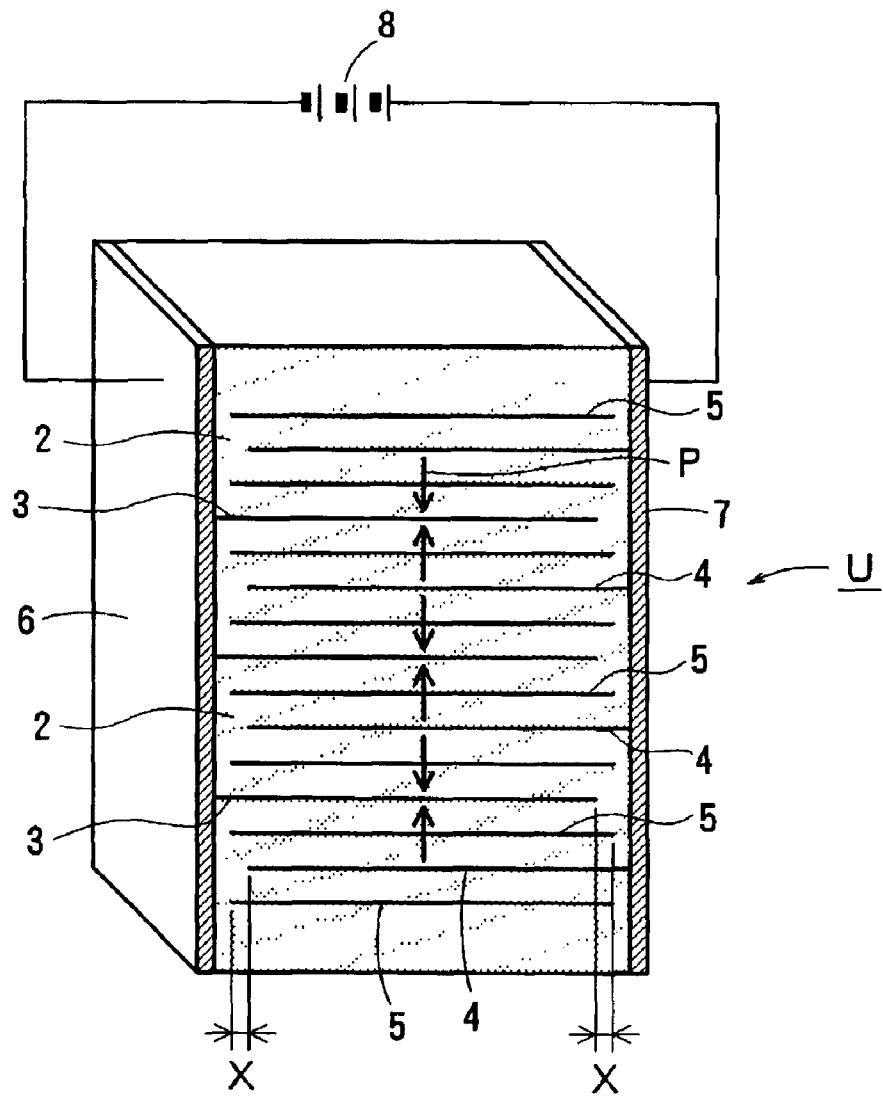
FIG. 4 is a half-sectional perspective view of an example of the unit.
Figure 5:
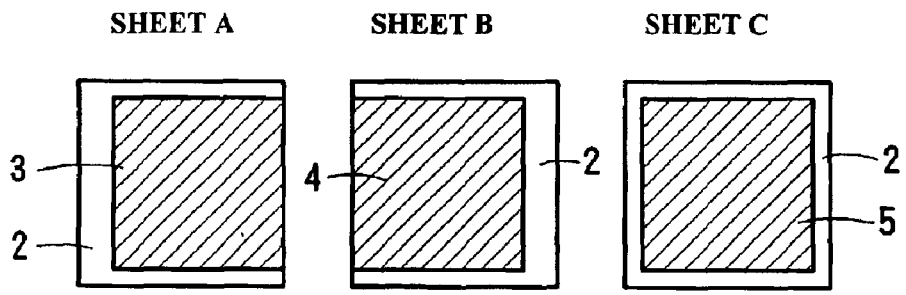
FIG. 5 illustrates an electrode pattern of each ceramic layer shown in FIG. 4.

FIG. 4 illustrates an example of the unit U (ceramic sintered body), and FIG. 5 illustrates a pattern of each internal electrode.

The unit U has a structure in which a plurality of piezoelectric ceramic layers 2 are placed upon each other, with a plurality of internal electrodes 3 to 5 being formed between the corresponding ceramic layers 2. As shown in FIG. 5, one end of each of the internal electrodes 3 is exposed at one side surface of its corresponding ceramic layer 2. One end of each internal electrode 4 opposite to the one end of each of the internal electrodes 3 is exposed at the opposite side surface of its corresponding ceramic layer 2. Each internal electrode 5 is a float electrode which is not exposed at either of the side surfaces of its corresponding ceramic layer 2. The internal electrodes 3 to 5 preferably have the same form. The internal electrodes 3 and 4 are displaced by distances X in the direction of a plane and in opposite directions with respect to its corresponding float electrode 5. A polarization electrode 6 and a polarization electrode 7 are formed at opposing surfaces of the unit U, with the electrode 6 being connected to each of the internal electrodes 3 and the electrode 7 being connected to each of the internal electrodes 4. By applying a dc voltage 8 between the polarization electrodes 6 and 7, the piezoelectric ceramic layers 2 interposed between their corresponding internal electrodes 3 and 4 are polarized in opposite directions as shown by arrows P in FIG. 4.

In this preferred embodiment, since the float electrodes 5 which are not exposed to the outside are all disposed between their corresponding internal electrodes 3 and 4, a reduction in the areas of the internal electrodes 3 and internal electrodes 4 by diffusion during baking of the unit U is reliably prevented by the float electrodes 5, so that a reduction in a difference Δf between a resonant frequency and an antiresonant frequency is prevented. Therefore, a length mode piezoelectric resonator having a resonance characteristic in accordance with design values is provided.

Figure 6:
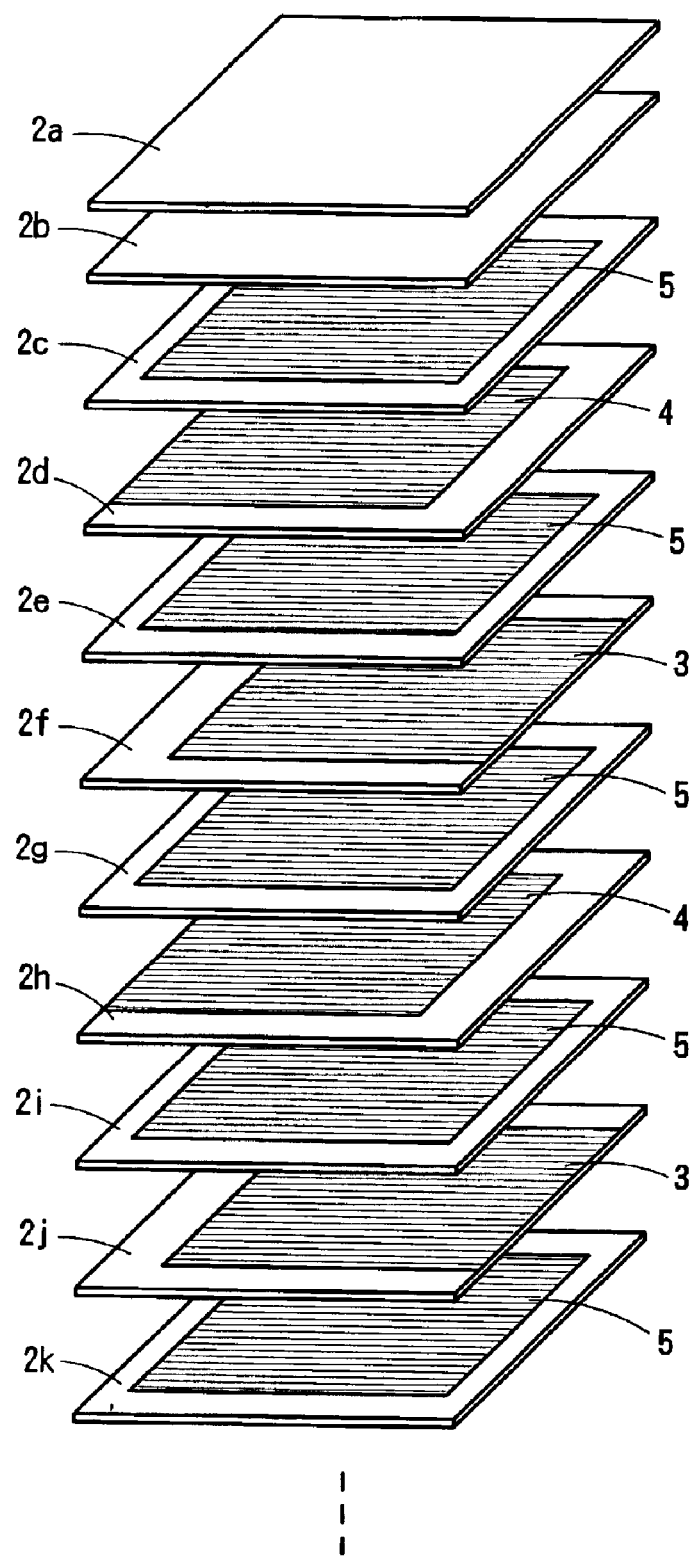
FIG. 6 is an exploded perspective view of the unit shown in FIG. 4.

FIG. 6 is an exploded view showing the unit U in more detail.

Ceramic layers 2a and 2b not having internal electrodes are disposed at the outermost side of the unit U. Next, a ceramic layer 2c having a float electrode 5, a ceramic layer 2d having an internal electrode 4, a ceramic layer 2e having a float electrode 5, and a ceramic layer 2f having an internal electrode 3 are successively disposed in that order. Thereafter, similarly, a ceramic layer 2g having a float electrode 5, a ceramic layer 2h having an internal electrode 4, a ceramic layer 2i having a float electrode 5, a ceramic layer 2j having an internal electrode 3, and a ceramic layer 2k having a float electrode 5 are successively placed upon each other.

After forming the polarization electrodes 6 and 7 on the unit U (ceramic sintered body) as described above, and performing polarization, the unit U is severed by certain widths in order to form a strip S. After forming insulating films and external electrodes on the strip S, the strip S with the insulating films and the external electrodes is cut to produce a multilayer piezoelectric resonator E shown in FIG. 10.

In the above-described preferred embodiment, as shown in FIG. 5, although, of the internal electrodes 3 to 5 formed on the green sheets which have been punched out, the internal electrodes 3 and 4 are formed so as to be exposed at opposing end surfaces of the unit U, the present invention is not limited thereto.

Figure 7:
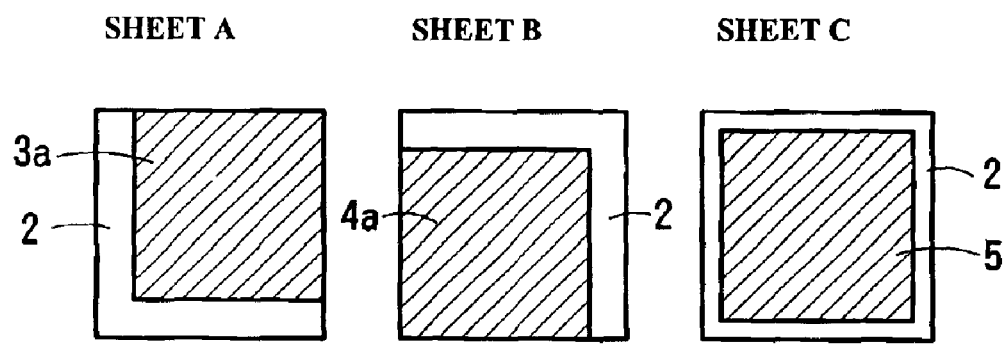
FIG. 7 illustrates another electrode pattern of each ceramic layer shown in FIG. 4.

In FIG. 7, an internal electrode 3a is exposed at two adjacent surfaces of the unit U, and an internal electrode 4a is exposed at adjacent surfaces of the unit U which are different from the adjacent surfaces at which the internal electrode 3a is exposed.

Figure 8:
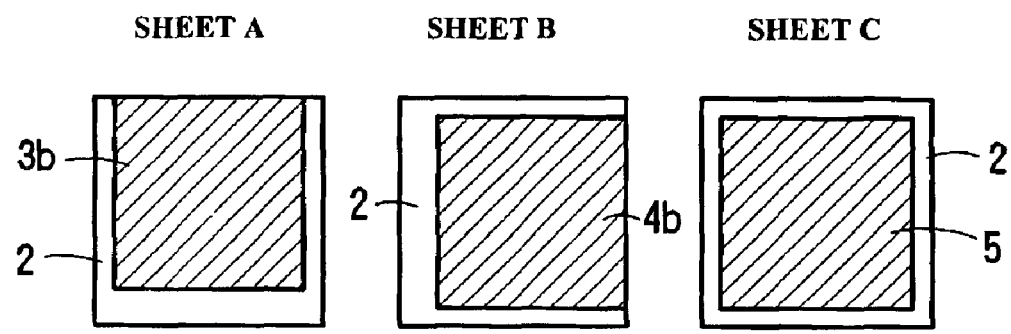
FIG. 8 illustrates still another electrode pattern of each ceramic layer shown in FIG. 4.

In FIG. 8, a surface at which an internal electrode 3b is exposed and a surface at which an internal electrode 4b is exposed are preferably substantially perpendicular to each other. In other words, they are exposed at adjacent surfaces of the unit U.

The patterns shown in FIGS. 5, 7, and 8 may be arbitrarily combined. By using these patterns in combination, it is possible to arbitrarily change the direction in which the internal electrodes are drawn out, thereby providing the advantage that the design freedom of the piezoelectric resonator is increased.

Figure 9:
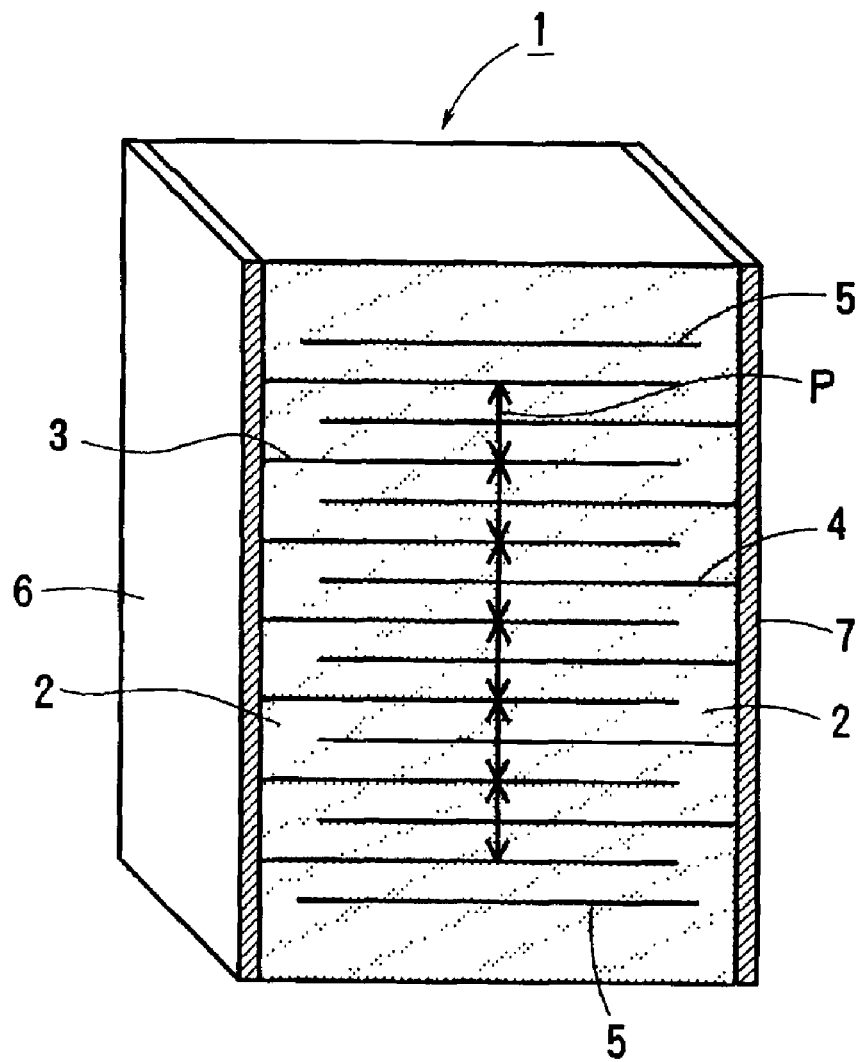
FIG. 9 is a half-sectional perspective view of another example of the unit used to produce the multilayer piezoelectric resonator of the present invention.

Although, in FIG. 4, the float electrodes 5 are preferably provided in the outermost ceramic layers 2 and in the ceramic layers 2 between their corresponding internal electrodes 3 and 4 of the unit U, float electrodes 5 may be provided only in the outermost ceramic layers 2 as shown in FIG. 9, in which case a similar diffusion prevention effect can be realized. In that case, by applying a dc voltage between the polarization electrodes 6 and 7, adjacent ceramic layers 2 are polarized in opposite directions as shown by the arrows P in FIG. 9 between their corresponding internal electrodes 3 and 4.

Figure 10:
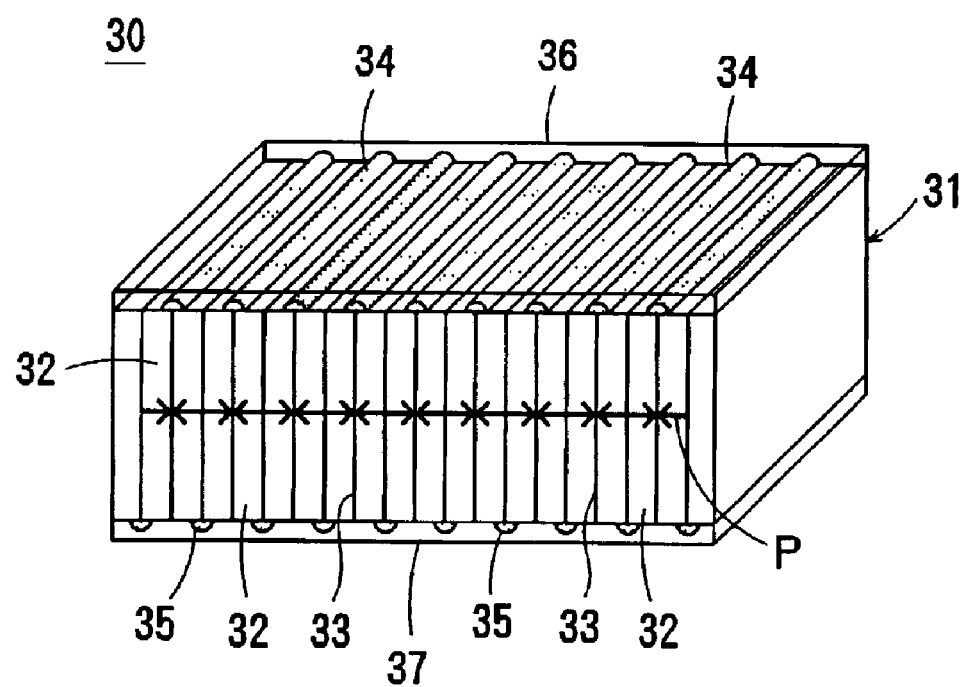
FIG. 10 is a perspective view of an example of the multilayer piezoelectric resonator.

In the above-described preferred embodiment, although a piezoelectric resonator having insulating films that cover every other internal electrode as shown in FIG. 10 has been described, the present invention is not limited thereto. For example, as disclosed in Japanese Unexamined Patent Application Publication No. 10-4330, by changing the locations at which the internal electrodes are exposed, or by providing grooves, the present invention is applicable to a piezoelectric resonator not having any insulating films.

As is clear from the above description, according to the method of producing a piezoelectric resonator according to a preferred embodiment of the present invention, since float electrodes are provided in the ceramic layers between the corresponding internal electrodes and at the outer ceramic layers, diffusion of metals of the internal electrodes in the ceramic during baking of a unit is prevented, so that it is possible to restrict a reduction in Δf.

In addition, since only one type of print pattern is used, the production process is greatly simplified, and the process from printing to punching to stacking can be carried out in one production line, thereby allowing for greatly reduced production costs.

Further, since, after the electrodes have been formed on a green sheet, the green sheet is punched with previously determined shift amounts with reference to the locations of the electrodes, the electrodes on the punched out green sheets are consistently positioned precisely. When such green sheets are placed upon each other, highly precise stacking can be carried out without the influence of shifted printing of the electrodes.

In addition to the advantages described above, the method of other preferred embodiments of the present invention provides the advantage of increased design freedom of the piezoelectric resonator because the internal electrodes can be drawn out to adjacent side surfaces in addition to opposing side surfaces of a unit.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method of producing a multilayer piezoelectric resonator, the method comprising the steps of:

forming internal electrodes by printing an electrically conductive paste onto a surface of a green sheet formed of piezoelectric ceramic;

punching out portions of the green sheet having the internal electrodes formed thereon with certain sizes, so that at least three types of green sheets including a first green sheet, a second green sheet, and a third green sheet, are punched out with a particular location of each respective corresponding internal electrode serving as a reference location, in which the first green sheet is punched out by shifting a punching location by a first shift amount in a first direction with respect to the reference location, the second green sheet is punched out by shifting a punching location by the first shift amount in a direction opposite to the first direction, and the third green sheet is punched out at the reference location;

forming a layered body by placing the punched out green sheets upon each other in a predetermined order;

forming a unit by cutting the layered body, with the cutting operation being performed so that the internal electrode formed on the first green sheet and the internal electrode formed on the second green sheet are exposed at opposing end surfaces of the unit, and so that the internal electrode formed on the third green sheet is not exposed at an end surface of the unit; and forming a ceramic sintered body by baking the unit formed by the cutting operation.

2. A method of producing a multilayer piezoelectric resonator according to claim 1, wherein the first shift amount is greater than a thickness of the corresponding green sheet between corresponding adjacent internal electrodes in a thickness direction.

3. The method according to claim 1, further comprising the step of forming float electrodes between the Internal electrodes of the green sheets in the layered body.

4. The method according to claim 1, wherein the ceramic sintered body includes outermost ceramic layers having no electrodes formed thereon and inner ceramic layers having the internal electrodes formed thereon, wherein float electrodes are provided only on the outermost ceramic layers.

5. The method according to claim 1, wherein the ceramic sintered body includes outermost ceramic layers having no electrodes formed thereon and inner ceramic layers having the internal electrodes formed thereon, wherein float electrodes are provided on the inner ceramic layers and on the outermost ceramic layers.

6. The method according to claim 1, further comprising the step of forming insulating films on every other adjacent one of the internal electrodes that are exposed on an outer surface of the ceramic sintered body.

7. A method at producing a multilayer piezoelectric resonator, the method comprising the steps of:

forming internal electrodes by printing an electrically conductive paste onto a surface of a green sheet formed of piezoelectric ceramic;

punching out portions of the green sheet having the internal electrodes formed thereon, so that at least three types of green sheets including a first green sheet, a green second sheet, and a third green sheet, are punched out with a particular location of its corresponding internal electrode serving as a reference location, in which the first green sheet is punched out by shifting a punching location by a first shift amount in a first direction with respect to the reference location, the second green sheet is punched out by shifting a punching location by a second shift amount in a direction substantially at right angles to the first direction, and the third green sheet is punched out at the reference location;

forming a layered body by placing the punched out green sheets upon each other in a predetermined order;

forming a unit by cutting the layered body, with the cutting operation being performed so that the internal electrode formed on the first green sheet and the internal electrode formed on the second green sheet are exposed at adjacent end surfaces of the unit, and so that the internal electrode formed on the third green sheet is not exposed at an end surface of the unit; and forming a ceramic sintered body by baking the unit formed by the cutting operation.

8. A method of producing a multilayer piezoelectric resonator according to claim 7, wherein the first shift amount and the second shift amount are greater than thicknesses of the corresponding green sheets between corresponding adjacent internal electrodes in a thickness direction.

9. The method according to claim 7, further comprising the step of forming float electrodes between the internal electrodes of the green sheets in the layered body.

10. The method according to claim 7, wherein the ceramic sintered body includes outermost ceramic layers having no electrodes formed thereon and inner ceramic layers having the internal electrodes formed thereon, wherein float electrodes are provided only on the outermost ceramic layers.

11. The method according to claim 7, wherein the ceramic sintered body includes outermost ceramic layers having no electrodes formed thereon and inner ceramic layers having the internal electrodes formed thereon, wherein float electrodes are provided on the inner ceramic layers and on the outermost ceramic layers.

12. The method according to claim 7, further comprising the step of forming insulating films on every other adjacent one of the internal electrodes that are exposed on an outer surface of the ceramic sintered body.

* * * * *